United States Patent [19]

Swindal et al.

[11] Patent Number: 4,883,768

[45] Date of Patent: Nov. 28, 1989

[54] MESA FABRICATION IN SEMICONDUCTOR STRUCTURES

[75] Inventors: James L. Swindal, East Hampton; Daniel H. Grantham, Glastonbury, both of Conn.

[73] Assignee: United Technologies Corporation, Hartford, Conn.

[21] Appl. No.: 317,309

[22] Filed: Feb. 28, 1989

[51] Int. Cl.⁴ .............................................. H01L 29/06
[52] U.S. Cl. ...................................... 437/61; 437/69; 156/649; 156/661.1; 357/56; 357/26
[58] Field of Search ............... 437/69, 70, 71, 228, 437/72, 229, 61, 940; 156/643, 649, 661.1; 357/56, 26; 148/DIG. 135

[56] References Cited

U.S. PATENT DOCUMENTS

| 4,167,745 | 9/1979 | Ishibashi et al. ..................... 357/56 |
| 4,635,344 | 1/1987 | Havemann ............................. 437/70 |

FOREIGN PATENT DOCUMENTS

| 58-46648 | 3/1983 | Japan ..................................... 437/70 |
| 59-165434 | 9/1984 | Japan ..................................... 437/70 |
| 59-186343 | 10/1984 | Japan ..................................... 437/70 |
| 60-21541 | 2/1985 | Japan ..................................... 437/72 |

Primary Examiner—Olik Chaudhuri

[57] ABSTRACT

Semiconductor structures for electronic use, such as for example a silicon-glass-silicon pressure sensor (Fig. 3), include mesa or pedestal structures (12A) extending up from silicon substrates (12). In the invention the mesa structures are fabricated in an oxidation process applied in a cyclical fashion (steps 1-3 through 1-5 of Fig. 1). Each cycle includes a photolithographic operation to protect the previously grown oxide on the mesas from etching. During each cycle less oxide is grown (or conversely silicon consumed) on the mesas than in the preceding cycle, while equivalent amounts of oxide are grown on non-mesa areas in each cycle. As a result, the tops of the mesas get higher and higher above the surrounding areas in each cycle. In order to prevent the leaving of any oxide "scraps" in a non-mesa area during the oxidation steps, resulting from a flaw in the mask, a double exposure process is used, utilizing two completely independent masks, with a positive working photo-resist.

5 Claims, 2 Drawing Sheets

MESA FABRICATION IN SEMICONDUCTOR STRUCTURES

Reference to Related Application

This application relates to some of the same subject matter as the following, co-pending application, the disclosure of which is incorporated herein by reference:

Ser. No. 07/292,282, filed Dec. 30, 1988, entitled "Capacitive Pressure Sensor With Minimized Dielectric Drift" by Bullis, Swindal, Wiegand, Brahm & Meyer.

Technical Field

This invention relates to semiconductor structures and more particularly to the fabrication of mesas in such structures.

Background Art

Many semiconductor structures used in the electronic arts include one or more "mesa" or pedestal structures on their exterior, operative surfaces, which mesas extend above the main surface of the semiconductor substrate. A typical example, among many, of such a structure is a capacitive pressure sensor.

Capacitive pressure sensors are well known and are employed in capacitance transducers, microphones, rupture discs, resonators, vibrators and like devices. Some of the capacitive pressure sensors require that the sensors be extremely small, for example, of the order of about eight millimeters by eight millimeters (8 mm × 8 mm) or less and are typically made in a silicon-glass-silicon sandwich design.

An exemplary prior art, silicon-glass-silicon pressure sensor design of the sandwich type is illustrated in FIG. 3. Such a sensor or transducer 10, which typically is generally square in its exterior configuration but often at least generally circular and preferably circular or cylindrical in shape for its inner, operative substructure, generally identified as "$C_c$" in FIG. 3, includes an upper, conductive, square, flexible, appropriately doped, silicon diaphragm 11 and a lower or bottom, conductive, appropriately doped, silicon base or substrate 12 with a non-conductive dielectric layer and spacer 13 (made of, for example, borosilicate glass) between them.

A closed, evacuated, hermetically sealed, reference cavity, chamber or interstice 14 is formed between the two silicon layers 11, 12. The chamber 14 is typically at a zero pressure or vacuum, or can be sealed at a higher reference pressure, at which reference level the diaphragm 11 is parallel to the silicon substrate 12, with typically a two micrometer spacing between the two.

A centrally located, typically circular pedestal or mesa 12A extends into the typically generally cylindrical, closed chamber 14 with a thin, insulating layer of glass 13A covering the top of the mesa. The circular mesa 12A serves as a counter-electrode to the deformable capacitor plate or diaphragm 11.

The mesa 12A extends up from the main surface of the silicon substrate 12 an exemplary six and a half micrometers, while having an exemplary diameter of one hundred and fifty thousandths (0.150") of an inch.

It is to the fabrication of such an exemplary mesa 12A in the exemplary semiconductive, silicon base or substrate 12 that the present invention is directed.

With respect to the prior art techniques for fabricating such mesas in a semiconductive substrate, micromachining techniques have been used. However, with such an approach for depths of more than one or two micrometers, the mesas had a tendency to be somewhat non-uniform with objectionable surface irregularities.

The method of choice for assembly of the two basic parts 11 & 12 of the sensor 10 is field aided bonding, a technique which does not involve any flow of the spacer (sealant) material and which therefore does not tolerate, or compensate for, irregularities. However, silicon etching techniques, wet or dry, leave irregularities on the etched surface that increase in size (height), as the amount of silicon removed increases.

Preferential thermal oxidation with a deposited oxidation mask, a diffusion controlled process, leaves surfaces essentially as smooth at the end of the procedure as at the beginning. However, control of the character of the oxidation mask (silicon nitride or other oxidation resistant material) to avoid any thermal expansion mismatch and consequent bowing of the substrate is critical and very difficult.

In contrast, as will be better understood below, the present invention provides a procedure for achieving the required geometry, while avoiding the problems associated with silicon etching and oxidation masking.

For further general background information on the exemplary application for the present invention, namely, in the fabrication of the pressure sensor 10, it is noted that the wall(s) 16 might typically have a horizontal, lateral or radial thickness of, for example, thirty-six thousandths (0.036") of an inch with a height of, for example, nine (9) micrometers, while the separately applied, insulating, mesa layer of glass 13A is only about a half a micrometer thick.

The silicon diaphragm 11 and the silicon base 12 may typically be square [with corners removed for the purpose of providing access for electrical contacts to the layer(s), as illustrated], having a horizontal length of an exemplary two hundred and sixty thousandths (0.260") of an inch on an edge, while the spacer wall 16 can have an inner diameter of an exemplary one hundred and ninety thousandths (0.190") of an inch. The outer, side surface of the wall spacer 16 can either follow the basic square configuration of the silicon layers or having an outer circular configuration.

It should be understood that the simplified FIG. 3 hereof for practical purposes of illustration is not at all to relative scale, as the glass wall or spacer 13/16 is only typically nine micrometers high, in contrast to the thicknesses of the silicon layers 11 & 12, which typically are eight thousandths (0.008") of an inch and fifty thousandths (0.050") inches thick, respectively, for an exemplary fifty (50 psi) pounds per square inch pressure measuring unit.

The operation of the exemplary pressure sensor 10 is described in the above-referenced application Ser. No. 07/292,282. Additionally, for further general background purposes, it is noted that another, exemplary, prior art, three plate, silicon-glass-silicon (SGS) device is particularly described in assignee's U.S. Pat. No. 4,467,394 of Grantham & Swindal, the inventors hereof, issued Aug. 21, 1984.

Of course the methodology of the present invention can be used to produce many different products which need a raised mesa on a semiconductor substrate, other than pressure sensors, and the latter is merely detailed herein for purposes of providing one exemplary product that can be manufactured with the methodology of the present invention.

Disclosure of Invention

The present invention provides a procedure for mesa fabrication in a semiconductor structure using an oxidation process, but one in which there is no requirement for a deposited oxidation resistant mask.

In the invention the mesa structures are fabricated in an oxidation process applied in a cyclical fashion. Each cycle includes a photolithographic operation to protect the previously grown oxide on the mesas from etching.

During each cycle less oxide is grown (or conversely silicon consumed) on the mesas than in the preceding cycle, while equivalent amounts of oxide are grown on non-mesa areas in each cycle. As a result, the tops of the mesas get higher and higher above the surrounding areas in each cycle.

In order to prevent leaving any oxide "scraps" in a non-mesa area during any oxidation step, a double exposure process is used, utilizing two completely independent masks, and a positive working photo-resist is used, which eliminates any such "scraps".

Other features and advantages will be apparent from the specification and claims and from the accompanying drawings, which illustrate an exemplary embodiment of the invention.

Best Mode for Carrying Out the Invention

Figure 1:
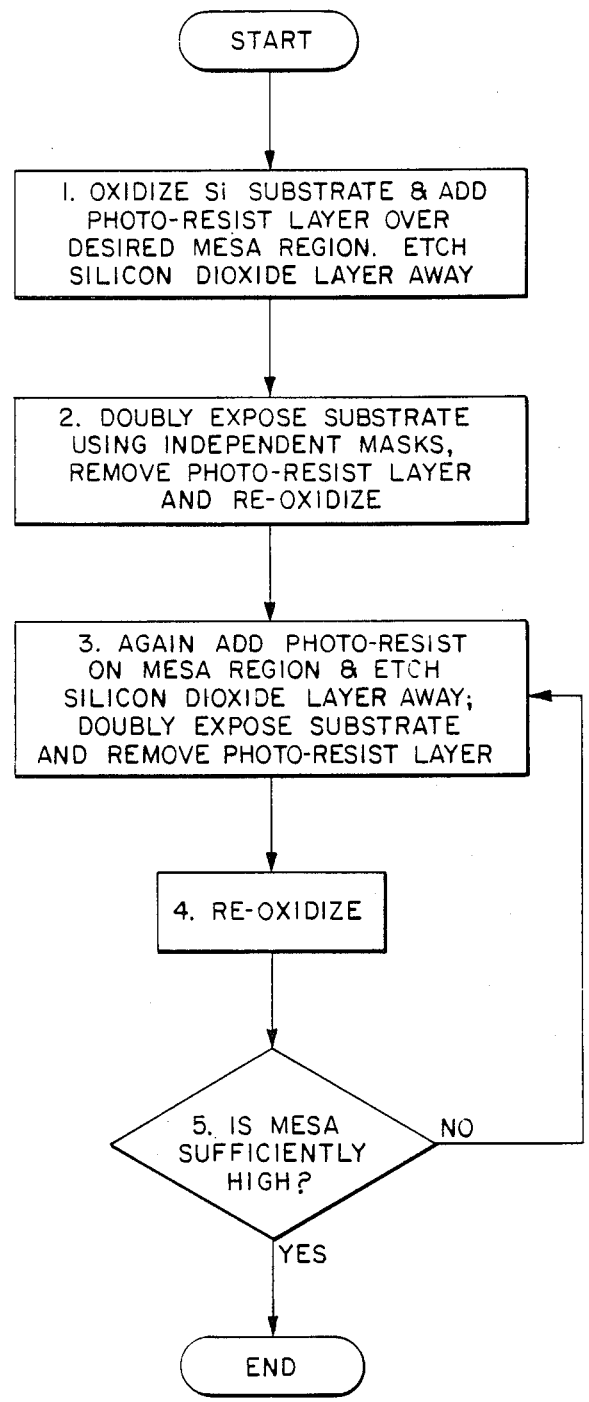
FIG. 1 is a block diagram showing in flow chart fashion the general, cyclical methodology of the exemplary methodology of the present invention.
Figure 2:
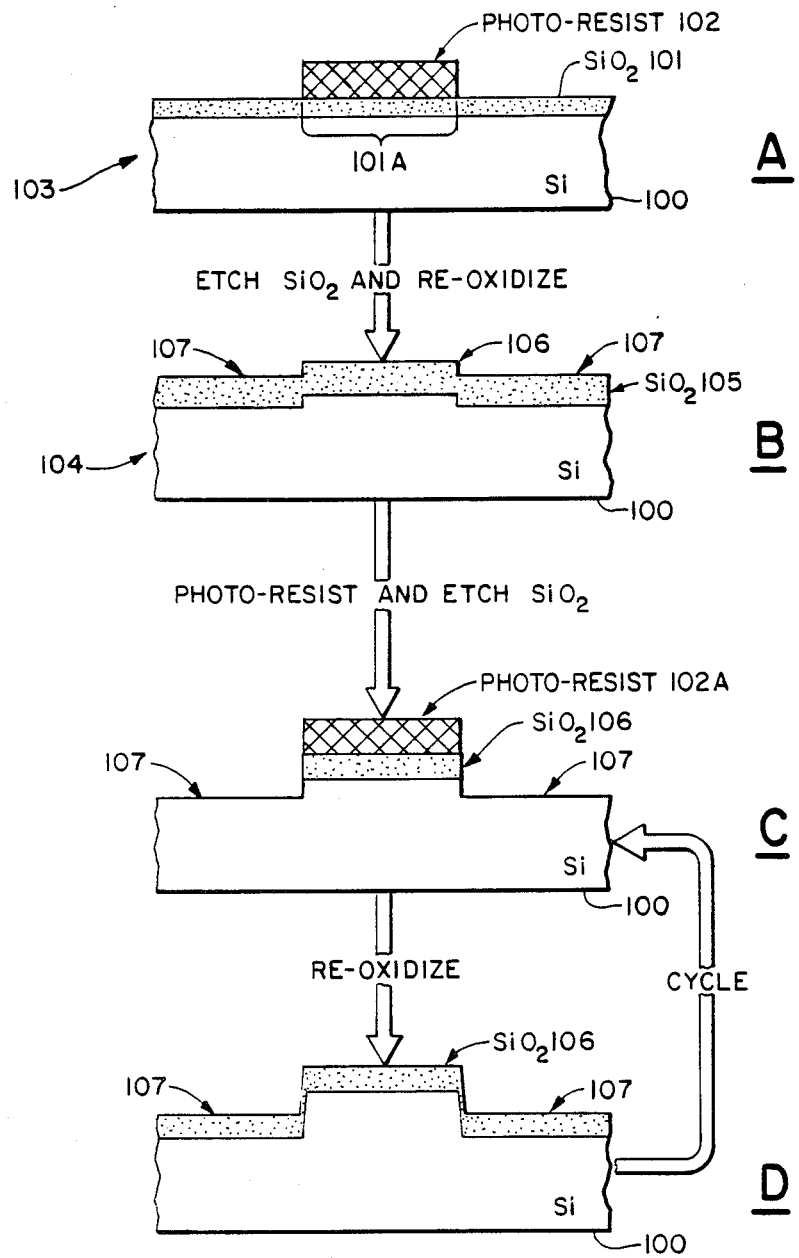
FIG. 2 (Parts A–D) are side views of a silicon substrate showing the progressive formation of the mesa in the semiconductor structure as the step-by-step methodology of FIG. 1 is utilized, with part of the methodology cyclically repeated until the mesa or pedestal has reached the desired height.

With particular reference to FIGS. 1 & 2, in step 21 the silicon layer 100 is oxidized to produce the initial silicon dioxide layer 101 on the upper surface of the silicon material using standard, technology well known to those of ordinary skill in the art. The silicon material would typically be provided in wafer form and be doped to be either of the "N" or "P" type. Such a doped material could have, for example, $10^{18}$ impurity per cubic centimeter, so as to achieve something under, for example, one-tenth (0.1) ohm centimeter conductivity.

A photo-resist layer 102 is then deposited in the desired mesa region(s) 101A, using standard, well known deposition techniques, producing the preliminary structure or substrate 103 of FIG. 2 (A).

Such a photo-resist layer 102 could have an exemplary thickness of about one to three (1–3) micrometers or less and typically forms circular pattern(s) to ultimately produce circular mesa(s). Although a circularly shaped mesa is usually preferred, other shapes, such as a square or other polygon, are possible.

Typically, to take advantage of "mass" production techniques, multiple semiconductor product sites are formed at the same time from a common substrate wafer and later subdivided or diced for the individual products, each of which would have at least one mesa or pedestal. However, if so desired, a single substrate with a single mesa could be individually made.

In step 1-2 a wet silicon dioxide etch, such as, for example, buffered hydrofluoric acid, using standard, well known technology, is then evenly applied to the upper surface of the preliminary substrate 103 until the unprotected silicon dioxide layer is removed. Because the etch removes all of the silicon dioxide layer surrounding the photo-resist layer 102 but does not significantly etch away the silicon dioxide layer beneath the photo-resist layer, the silicon dioxide layer 105 remains in the mesa region 106, making it effectively higher than the surrounding, non-mesa region 107, as can be seen in FIG. 2 (B).

Figure 3:
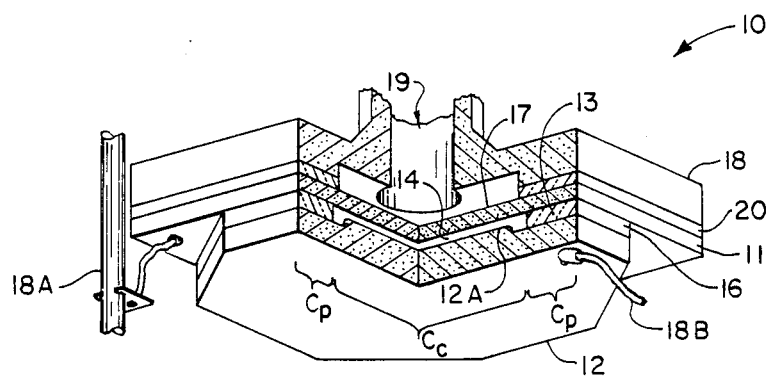
FIG. 3 is a perspective, partially cut-away view of an exemplary silicon-on-silicon capacitive pressure sensor of the prior art, which in its manufacture can utilize the mesa fabrication approach of the present invention, as an exemplary application of the present invention.

In producing the mesa, it is important to insure that the areas surrounding the mesa be free of any surface irregularities or "scraps", particularly in the areas in which the glass spacer (note glass layer 16 and the areas "$C_p$" of FIG. 3) is to be joined to the silicon substrate or base (12) surrounding the mesa 12A. Otherwise, leaks or other problems may result.

To insure that there are no lumps or "scraps", which would otherwise prevent an hermetic seal from being formed between the base and the glass spacer, two, "identical" but independent masks are preferably used, and the photo-resist layer 102 is doubly exposed in the photolithographic operation to ultraviolet light. As is well known, the exposure to the ultraviolet light makes the photo-resist layer soluble, allowing it to be removed by a chemical developer.

Two such "identical" masks with double exposure are used, so that, if flaws in the masks were present, it would be statistically improbable, nigh unto impossible, for the flaws to be in the same location. Thus, a proper exposure of the substrate is insured. Additionally, a positive photo-resist preferably is used, because the presence of a flaw in a negative photo-resist would render the flaw effectively unremovable.

Thereafter, the photo-resist layer 102 is removed by the chemical developer, using standard well known technology, producing the intermediate substrate 104 of FIG. 2 (B). The intermediate substrate 104 is then re-oxidized.

In step 1-3 a photo-resist layer 102A again is provided on the upper surface of the mesa region 106, and the silicon dioxide etching step repeated, in similar fashion to the methodology followed in the photo-resist and etching sub-steps of steps 1-1 & 1-2, respectively. Again, as a result of the presence of the photo-resist layer, the mesa region 106 becomes still higher than the surrounding area 107 [note FIG. 2 (C)].

The intermediate substrate is then re-oxidized in step 1-4, and a determination made in step 1-5 as to whether the mesa region 106 of FIG. 2 (D) is at the desired height above the surrounding area 107. If it is, the process of making the mesa or pedestal is complete. If not, steps 1-3 through 1-5, inclusive, are cyclically repeated until the desired height is reached.

Thus, as generally can be seen in FIG. 1, in the exemplary methodology of the invention the mesa or pedestal structures are fabricated in an oxidation process applied in a cyclical fashion. Each cycle includes a photolithographic operation to protect the previously grown oxide in the mesa area(s) from etching.

During each cycle less oxide is grown (or conversely silicon consumed) on the mesas than in the preceding cycle, while equivalent amounts of oxide are grown on non-mesa areas in each cycle. As a result, the tops of the mesas get higher and higher above the surrounding areas of the substrate in each cycle.

Additionally, in order to prevent leaving any oxide "scraps" in a non-mesa area during any of the oxidation steps due to a flaw in the mask, a double exposure process is used in the photolithographic operation, utilizing two completely independent but substantially identical masks, in conjunction with a positive working photo-resist.

For further general information on other details of the methodology, which can be used in connection with the manufacture of the exemplary pressure sensor, which details are not part of the present invention, reference is had to assignee's U.S Pat. Nos. 4,513,348 entitled "Low Parasitic Capacitance Pressure Transducer and Etch Stop Method" of Daniel H. Grantham issued Apr. 23, 1985, and 4,405,970 entitled "Silicon-Glass-Silicon Capacitive Pressure Transducer" of the inventors hereof issued Sept. 20, 1983, as well as to, for example, *Physics and Technology of Semiconductor Devices* by A. S. Grove (John Wiley & Sons, NY; 1967) and *INTEGRATED CIRCUITS—Design Principles and Fabrication* (Motorola Series in Solid State Electronics) edited by Raymond M. Warner, Jr. & James N. Fordemwalt (McGraw-Hill, NY; 1965), the disclosures of which are incorporated herein by reference. With respect to the last reference, note particularly pages 298+ for a discussion of the etching and photo-resist aspects of the known technology.

Although this invention has been shown and described with respect to a detailed, exemplary embodiment thereof, it should be understood by those skilled in the art that various changes in methodology and/or approach may be made without departing from the spirit and scope of this invention.

Having thus described at least one exemplary embodiment of the invention, that which is new and desired to be secured by Letters Patent is claimed below:

1. A method of fabricating a mesa in a semiconductor structure, comprising the following step(s):
   (a) fabricating the mesa in an oxidation process applied in a cyclical fashion, with each cycle including a photolithographic operation protecting the previously grown oxide on the mesa from etching while exposing the areas surrounding the mesa to etching; and
   (b) during each cycle growing less oxide and conversely consuming less silicon on the mesa than in the preceding cycle, while growing substantially equal amounts of oxide on the non-mesa areas surrounding the mesa in each cycle, causing the top of the mesa to get higher above the surrounding areas in each cycle in comparison to the preceding cycle.

2. The method of claim 1, wherein there is included the step(s) of:
   using a silicon substrate and in the oxidation process forming a layer of silicon dioxide on the exterior surface of the silicon substrate.

3. The method of claim 2, wherein there is included the step(s) of:
   etching the silicon dioxide layer away with a wet chemical etch.

4. The method of claim 1, wherein there is included the step(s) of:
   providing a photo-resist layer over the mesa in the photolithographic operation protecting the previously grown oxide on the mesa from etching.

5. The method of claim 1, wherein there is included the following step(s):
   using a double exposure process in the photolithographic operation, utilizing two completely independent, substantially identical masks, in conjunction with a positive working photo-resist, effectively eliminating any oxide "scraps" in a non-mesa area during the oxidation step.

* * * * *